United States Patent
Paatero

(10) Patent No.: US 10,045,456 B2
(45) Date of Patent: Aug. 7, 2018

(54) HORIZONTAL UNINTERRUPTED POWER SUPPLY DESIGN

(71) Applicant: ABB Schweiz AG, Baden (CH)

(72) Inventor: Esa-Kai Paatero, Minusio (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/247,310

(22) Filed: Aug. 25, 2016

(65) Prior Publication Data

US 2016/0366781 A1    Dec. 15, 2016

Related U.S. Application Data

(63) Continuation of application No. PCT/EP2015/053603, filed on Feb. 20, 2015.

(30) Foreign Application Priority Data

Feb. 25, 2014 (EP) .................................... 14156618

(51) Int. Cl.
| | |
|---|---|
| *H05K 7/20* | (2006.01) |
| *H05K 7/14* | (2006.01) |
| *H02J 9/00* | (2006.01) |
| *H05K 5/02* | (2006.01) |

(52) U.S. Cl.
CPC .............. *H05K 7/1457* (2013.01); *H02J 9/00* (2013.01); *H05K 5/0217* (2013.01)

(58) Field of Classification Search
CPC ............................ H05K 7/1457; G06F 1/1632
See application file for complete search history.

(56) References Cited

U.S. PATENT DOCUMENTS

| | | | |
|---|---|---|---|
| 6,121,695 A * | 9/2000 | Loh .......................... | G06F 1/26 307/64 |
| 6,205,029 B1 * | 3/2001 | Byrne .................. | H05K 7/1457 174/68.2 |
| 6,317,348 B1 | 11/2001 | Vackar | |
| 6,324,607 B1 * | 11/2001 | Korowitz .......... | G05B 19/0423 361/679.4 |
| 6,336,828 B1 * | 1/2002 | Huerta .................... | G06F 1/189 361/727 |

(Continued)

FOREIGN PATENT DOCUMENTS

| | | |
|---|---|---|
| EP | 1835794 A2 | 9/2007 |
| EP | 2111088 A2 | 10/2009 |

OTHER PUBLICATIONS

European Patent Office, International Search Report & Written Opinion issued in corresponding Application No. PCT/EP2015/053603, dated Apr. 8, 2015, 9 pages.

(Continued)

*Primary Examiner* — Anthony Q Edwards
(74) *Attorney, Agent, or Firm* — Taft Stettinius & Hollister LLP; J. Bruce Schelkopf

(57) ABSTRACT

The present disclosure provides a docking frame for receiving at least one uninterrupted power supply module for high power uninterrupted power supply systems. The power supply system includes a bus connection for electrically connecting another uninterrupted power supply module to at least another docking frame and/or an I/O module. The one or more I/O modules, docking frames and uninterrupted power supply modules can be electrically connected in a horizontal arrangement.

16 Claims, 13 Drawing Sheets

(56) References Cited

U.S. PATENT DOCUMENTS

| | | | | |
|---|---|---|---|---|
| 6,881,101 B2* | 4/2005 | Sichner | ................ | H01R 13/514 |
| | | | | 439/278 |
| 7,133,292 B2* | 11/2006 | Uzuka | ..................... | G06F 1/184 |
| | | | | 361/728 |
| 8,427,815 B2* | 4/2013 | Fontana | ................... | H02B 1/20 |
| | | | | 361/601 |
| 8,681,479 B2* | 3/2014 | Englert | ................ | H05K 7/1457 |
| | | | | 174/50 |
| 8,922,992 B2* | 12/2014 | Shah | ................... | H05K 7/1488 |
| | | | | 165/80.1 |
| 9,089,067 B2* | 7/2015 | Gaub | ................... | H05K 7/1478 |
| 9,320,166 B1* | 4/2016 | Marr | ........................ | H05K 7/14 |
| 2003/0062183 A1* | 4/2003 | Schomaker | .......... | H05K 7/1457 |
| | | | | 174/50 |
| 2004/0133819 A1* | 7/2004 | Krishnamurthy | ......... | G06F 1/26 |
| | | | | 713/300 |
| 2004/0201972 A1* | 10/2004 | Walesa | ................. | H01R 25/164 |
| | | | | 361/788 |
| 2007/0217178 A1* | 9/2007 | Johnson, Jr. | .......... | H05K 7/1457 |
| | | | | 361/826 |
| 2010/0138586 A1 | 6/2010 | Wassermann | | |
| 2014/0146483 A1* | 5/2014 | Anderson | .............. | H02B 1/308 |
| | | | | 361/726 |

OTHER PUBLICATIONS

European Patent Office, Extended Search Report issued in corresponding Application No. 14156618.2, dated Oct. 24, 2014, 5 pp.

* cited by examiner

HORIZONTAL UNINTERRUPTED POWER SUPPLY DESIGN

TECHNICAL FIELD

The present invention relates to the area of uninterrupted power supply systems for high power uninterrupted power supply, typically with a power of at least tens of kilowatt, preferably a power of at least one hundred kilowatt.

BACKGROUND ART

These uninterrupted power supply (UPS) systems generally comprise a central system level hardware for connecting the UPS systems to a power distribution, for which uninterrupted operation has to be achieved. Hence, the system level hardware may comprise customer cable landings, bypasses, switch gears, system user interfaces and so on. This system level hardware can be provided commonly in an input/output (I/O) enclosure.

Typically, the UPS system further comprises at least one, usually multiple converters, also referred to as uninterrupted power supply modules, which store electrical power to provide it via the I/O connection enclosure to the power distribution. Number, size and power rating of the converters are chosen depending on the UPS system design based on customer requirements. In this area, UPS power systems with a power of at least 100 kW are common.

The converters are typically arranged in single, free standing enclosures, which are connected in parallel for providing power of at least tens of kilowatt. Accordingly, the converters can be provided in the enclosures side by side to each other, which enables formation of high power UPS systems. Also parallel connection of single converters through hard wired cabling to a common I/O enclosure is known. Accordingly, the converters are hard wired, e.g. by cables, to a central I/O enclosure.

Due to hard wiring and large building blocks, i.e. large enclosures for the converters, the above UPS systems are difficult to service, since removal of the converters is a major operation, and modification of the UPS system, e.g. an adaptation due to changed power requirements, resulting in an addition, removal or substitution of converters, is rather complicated, labor intensive and time consuming, since cable connection has to be disconnect and interference from adjacent enclosures and/or converters can occur, especially for a converter that is not located at an lateral end of a row. Also service safety can be very poor.

Even when cables are replaced by bus bars, the converters still have to be connected to the bus bars, so that the individual cabling effort for connecting the converters remains. Furthermore, the use of bus bars may reduce air circulation capabilities of the UPS system. Accordingly, the trend for hot/cold aisles and closed air paths can be compromised due to bus bar setup.

DISCLOSURE OF INVENTION

It is an object of the present invention to provide a docking frame for high power uninterrupted power supply systems, an uninterrupted power supply module for connection with the docking frame, and an uninterrupted power supply system, which enable easy and safe maintenance and system modification.

This object is achieved by the independent claims. Advantageous embodiments are given in the dependent claims.

In particular, the present invention provides a docking frame for receiving at least one uninterrupted power supply module for high power uninterrupted power supply systems, typically with a power of at least tens of kilowatt, preferably a power of at least one hundred kilowatt, comprising connection means for electrically connecting the uninterrupted power supply module horizontally to at least another docking frame and/or an I/O module, whereby the connection means comprises at least one bus connection means for providing the electrical connection to the at least another docking frame and/or the I/O module.

The present invention also provides an uninterrupted power supply module for high power uninterrupted power supply systems, typically with a power of at least tens of kilowatt, preferably a power of at least one hundred kilowatt, for connection with the above docking frame.

Furthermore, the invention provides an uninterrupted power supply system for high power uninterrupted power supply, typically with a power of at least tens of kilowatt, preferably a power of at least one hundred kilowatt, comprising an I/O module for electrically connecting the uninterrupted power supply system, at least one docking frame as specified above, and at least one uninterrupted power supply module as specified above, whereby the I/O module and the at least one docking frame are provided in a horizontal arrangement, and the docking frame receives the at least one uninterrupted power supply module.

The basic idea of the invention is to provide the docking frames for flexible connection of uninterrupted power supply (UPS) modules, whereby the docking frames enable flexible use in UPS systems due to the bus connection means, which facilitate connection of a docking frame to another docking frame. Such a UPS system is inherently very flexible for installation sites that typically require high UPS power and are undergoing frequent modifications or where power requirements are frequently modified. Also growing sites can easily be supported by UPS power, since the UPS system can easily be upgraded. The same refers, of course, also to a downgrade of the UPS system. The bus connection means enable a simple side-by-side architecture of the UPS system, with capability for great flexibility through installation life time. The side-by-side architecture enables in particular a simple electrically parallel architecture of the UPS system.

The docking frame refers to any kind of enclosure for receiving the at least one UPS module. An internal configuration of the docking frame can accommodate additional functionality and application specific requirements, for instance for scaling the UPS system or to handle specific currents and/or voltages, battery configurations or bypasses for neighboring docking frames. Accordingly, the docking frame may comprise functionality, which is typically provided in a central input/output (I/O) enclosure.

The docking frame can also provided integrally with the at least one uninterrupted power supply module, i.e. the docking frame and at least one UPS module can form a single unit for use in the UPS system. Accordingly, when such a single unit is connected to the UPS system, it is already ready for use, since installation of at least one UPS module is not required.

The docking frame can be provided with multiple bus connection means, so that multiple electrical connections can be formed. Accordingly, the docking frame can be capable of configurations for different current and voltage requirement. Furthermore, the docking frame can be provided with a system topology through choice of bus connection means at a pre-defined position, thereby e.g. indication maximum currents or used voltages.

The docking frame preferably has at least one frontal access position for receiving the at least one UPS module. Preferably, the docking frame is internally provided with a cover for covering electrical parts such as conductors, plugs or terminal. The cover is preferably removable.

The docking frame may be provided as input/output (I/O) frame comprising system level hardware. The system level hardware may comprise customer cable landings, bypasses, static bypasses, switch gears, system user interfaces, communication means, protection means, a distributed or a common battery and so on. The I/O frame can be provided as individual frame comprising only the system level hardware, the I/O frame can be provided without the possibility to receive at least on UPS module itself.

The docking frame can have system level protection, which is provided to be accessible from outside the docking frame, i.e. not requiring user access from inside. Hence, internal access is only required during service of the at least one UPS module. Preferably, the docking frame comprises non-user serviceable parts such as protection means like fuses.

Proper UPS module design is provided posing no additional constraints to the docking frame. This enables economic support of a standard design.

According to a modified embodiment of the invention the docking frame comprises at least one bus connection means for providing the electrical connection to the at least another docking frame and/or the I/O module at each lateral side. Accordingly, the docking frames, which are located side-by-side, form internally an electrical bus. The bus connection means at the lateral sides can be interconnected by means of any kind of electrical conductor, e.g. an electrical cable. An UPS system with a horizontal design, where the docking frames are provided side-by side, can easily be provided.

According to a modified embodiment of the invention the bus connection means at the lateral sides are interconnected by a horizontal bus bar. The horizontal bus bar facilitates internal connection of UPS modules. Handling of a bar as conductor is rather simple in respect to mounting and unmounting and for forming electrical connections to other conductors. Furthermore, the horizontal bus bar can be provided in accordance with a system topology through choice the bus bar at a pre-defined position, thereby e.g. indicating maximum currents or used voltages.

According to a modified embodiment of the invention the docking frame is provided to receive multiple uninterrupted power supply modules. The multiple UPS modules are preferably connected to one or a set of common bus connection means, i.e. the multiple UPS modules commonly provide e.g. power at a required voltage. Alternatively, the multiple UPS modules may also be connected to different bus connection means, e.g. for providing different voltages within one docking frame.

According to a modified embodiment of the invention the docking frame comprises at least one vertical bus bar for electrical connection of the at least one uninterrupted power supply module, whereby the at least one vertical bus bar is electrically connected to the bus connection means. The vertical bus bar facilitates the connection of the at least one UPS module to the bus connection means, since the connection of the UPS modules can be done to the vertical bus bar, which are locates close to the UPS modules. Handling of a bar as conductor is rather simple in respect to mounting and un-mounting and for forming electrical connections to other conductors. Furthermore, the vertical bus bar can be provided in accordance with a system topology through choice the bus bar at a pre-defined position, thereby e.g. indicating maximum currents or used voltages. Typically, at least one vertical bus bar is used when the docking frame is provided to receive multiple UPS modules on top of each other, i.e. the UPS modules are stacked on each other.

Preferably multiple uninterrupted power supply modules are connected to the vertical bus bar. This enables a simple electrical connection of multiple UPS modules to the docking frame and thereby to the bus connection means. Preferably, the docking frame comprises a horizontal bus bar for electrical connection to the vertical bus bar. Accordingly, the docking frame can comprises a system of orthogonal bus bars for simple and efficient electrical interconnection of the bus connection means and the UPS modules. In particular, when the docking frame comprises multiple vertical bus bars, each bus bar can be easily connected to one electrical pole of the UPS module.

According to a modified embodiment of the invention the docking frame comprises at least one electrical power connector for electrically connecting the at least one uninterrupted power supply module to the docking frame. The power connector facilitates the electrical connection of the at least one UPS module to the docking frame. The power connector can be a multi pole connector for connecting multiple poles at the same time. The multiple poles are preferably cable wired to bus bars, either horizontal or vertical, of the docking frame. Alternatively, multiple single pole connectors can be provided for electrically connecting one UPS module to the docking frame. Preferably, the multiple single pole connectors are provided in accordance with positions of bus bars, either horizontal or vertical, of the docking frame, so that the bus bars can be easily connected to different poles of the at least one UPS module. Accordingly, the power connectors can be provided as clips for directly connecting the at least one UPS module to the bus bar. The power connectors can be provided as male or female power connectors. Still further preferred, the power connectors are provided as hot swap connectors, which enable easy connection of the UPS module to the docking frame. The hot swap connector enables connection or removal of the UPS module without the use of tools by simple insertion of the UPS module into the docking frame or the respective removal. Furthermore, the operation of the UPS system does not have to be interrupted. The docking frame internally connects the connectors to the bus connection means, e.g. by means of internal bus bars.

According to a modified embodiment of the invention the docking frame comprises guiding means for guiding the at least one uninterrupted power supply module for insertion into the docking frame. The guiding means facilitate insertion and removal of the at least one UPS module from the docking frame. The guiding means can be differently designed depending on the used UPS modules. The guiding means may comprise guiding rails for guiding wheels or slider supports of a UPS module, which is movable on the ground. The guiding means may comprise guiding rails for supporting a UPS module. Accordingly, with multiple guiding rails provided on top of each other in the docking frame, multiple UPS modules can be stacked within the docking frame. The guiding means may comprise a lever for facilitating insertion and/or removal of a UPS module.

According to a modified embodiment of the invention the docking frame comprises an external control bus connector for horizontally connecting to a control bus for control of the at least one uninterrupted power supply module and at least one internal control bus connector for connection of the at least one uninterrupted power supply module. The control bus may be provided for control, service and maintenance of the at least on UPS module. The control bus enables central implementation of these features, e.g. in the I/O frame. Preferably the internal control bus connector is provided as a hot swap connector. Further preferred, the internal control bus connector is provided integrally with an electrical power connector.

According to a modified embodiment of the invention the bus connection means comprises an L-type connection bracket. The L-tape connection bracket enables compensation of misalignment of neighboring docking frames, so that the electrical connection can be easily made. The L-type connection bracket enables compensation for misalignment in two dimensions, thereby offering high flexibility in respect to adaptation to misalignment of neighboring docking frames. In alternative embodiments, the connection means may comprise overlapping bar ends or a tie bar for connecting bar ends of neighboring docking frames, which both enable compensation for lateral misalignment, i.e. one-dimensional compensation.

According to a modified embodiment of the invention the docking frame is provided to establish an additional ingress protection level for the at least one uninterrupted power supply module. The ingress protection level, also referred to ingress protection class, is typical liven in the format IPxy and indicates a protection of a device typically against ingress of humidity and particles, e.g. dust. A device without particular protection is typically classified as IP00, where an improved protection level is indicated by higher numbers. Accordingly, ingress protection for UPS modules can be improved using a proper docking frame with additional ingress protection, so that an UPS module within a docking frame may have a higher IP class than the UPS modules alone. Preferably, the docking frame is provided as a highframe for covering and/or enclosing the at least one uninterrupted power supply module. Depending on the design of the docking frame, different IP classes may be achieved.

According to a modified embodiment of the invention the docking frame is provided with at least one air channel for receiving exhaust air from the at least one uninterrupted power supply module and/or for providing air to the at least one uninterrupted power supply module. Accordingly, the docking frame can provide integrally an air circulation for the UPS modules, so that no respective installation has to be provided separately. The at least one air channel can be easily used for cooling the at least one UPS module, either by providing fresh, cool air to the at least one UPS module, and/or by removing air, which has been heated by the at least one UPS module. This can be implemented as an air circulation system using air channels provided in the docking frame. Preferably, the docking frame comprises at least on aperture for "connection" of the at least one UPS module, so that fresh air can be guided to the at least on UPS module or exhaust air can be removed from the at least one UPS module. Further preferred, the at least one aperture is sized and positioned to match an exhaust area of a rear air exhaust of the at least one UPS module to be inserted. Still further preferred, the at least one aperture is provided to enable air circulation through the docking frame. Accordingly, the design of the docking frame is to enable internal air circulation. The at least one air channel is preferably provided to guide exhaust air to internal bus bars, either horizontal or vertical, for cooling. The docking frame is preferably provided with an extension to permanently mate a duct for an air inlet and/or an air outlet based on a cooling system based on the use of air.

According to a modified embodiment of the invention the uninterrupted power supply module comprises wheels or a sliding support for insertion into the docking frame. Accordingly, the UPS module may be supported and moved on ground for connection with the docking frame.

According to a modified embodiment of the invention the uninterrupted power supply module comprises guiding means for being guided for insertion into the docking frame. The guiding means may comprise guide rails to facilitate insertion and/or removal of the UPS module to/from the docking frame. The guiding means may comprise a lever or a set of levers to facilitate insertion and/or removal of the UPS module to/from the docking frame.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
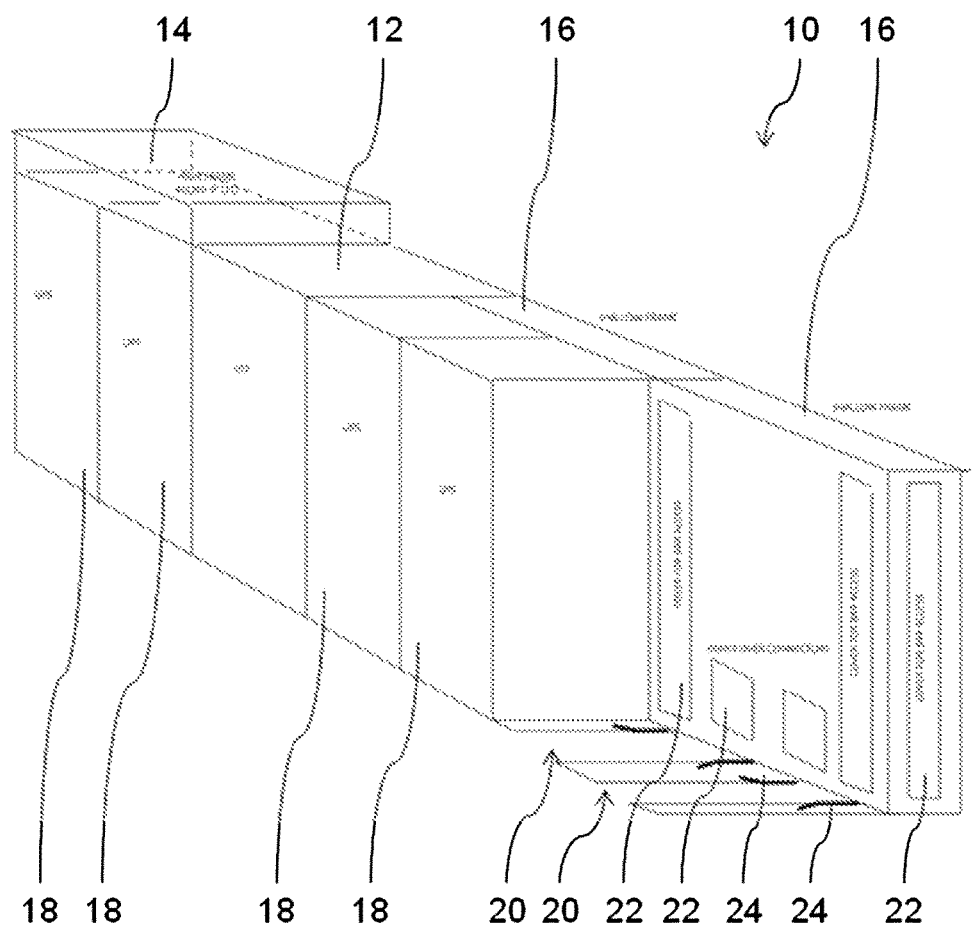
FIG. 1 shows a perspective view of a schematically shown uninterrupted power supply system comprising multiple docking frames, multiple uninterrupted power supply modules and an input/output enclosure according to a first embodiment of the invention.
Figure 2:
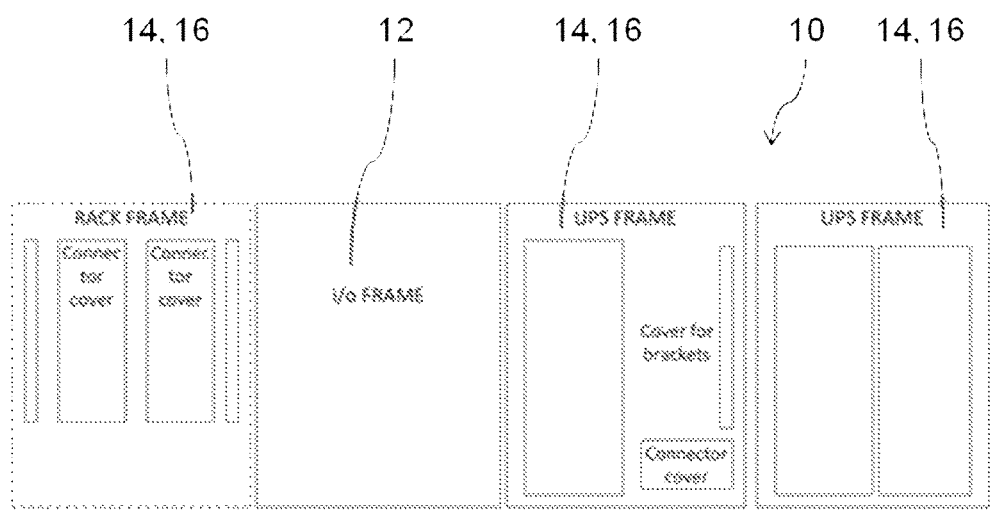
FIG. 2 shows a top view of a schematic drawing of the uninterrupted power supply system of FIG. 1 without the uninterrupted power supply modules.

FIG. 1 shows an uninterrupted power supply (UPS) system 10 according to a first, preferred embodiment. The UPS system 10 in this embodiment is a high power uninterrupted power supply system with a power of two hundred kilowatt.

The UPS system 10 comprises an input/output (I/O) module 12, also referred to as I/O enclosure. The I/O module 12 comprises system level hardware including customer cable landings, bypasses, static bypasses, switch gears, system user interfaces, communication means, protection means, a distributed and a common battery.

The UPS system 10 further comprises multiple docking frames 14, 16. The docking frames 14, 16 are provided as enclosures for receiving each two uninterrupted power supply modules 18, which are connectable side-by-side within one docking frame 14, 16. As can be seen in FIG. 1, two different kinds of docking frames 14, 16 are provided, a highframe 14 and a shallow frame 16. The highframe 14 is adapted for covering the two UPS modules 18 to establish an additional ingress protection level (IPxy) to the UPS modules 18.

In an alternative embodiment, the docking frames 14, 16 have an internal configuration accommodating additional functionality and application specific requirements, for instance for scaling the UPS system 10 or to handle specific currents and/or voltages, battery configurations, fuses or bypasses for neighboring docking frames 14, 16.

The UPS system 10 is provided as a horizontally arrange UPS system, where the I/O module 12 and the docking frames 14, 16 are provided side-by-side in a horizontal arrangement. The docking frames 14, 16 are provided in this embodiment with two frontal access positions 20 for receiving the each two UPS modules 18, i.e. one UPS module 18 per access position 20. The access positions 20 are provided to receive the two UPS modules 18 extending over the entire insertion height of the access positions 20. Accordingly, the UPS modules 18 can be arranged side-by side within each of the docking frames 14, 16. The docking frames 14, 16 are internally provided with removable covers 22 for covering electrical parts such as conductors, plugs or terminals, as described later in more detail.

As can be seen in FIG. 1, the docking frames 14, 16 comprise guiding means 24, which are provided as guiding rails in this embodiment. The guiding rails 24 are provided for guiding the UPS modules 18 for insertion into the docking frame 14, 16. Accordingly, the UPS modules 18 in this embodiment are provided with wheels for insertion into the access positions 20 into the docking frames 14, 16 and corresponding guiding means for being guided for insertion into the docking frame 14, 16.

Subsequently, different embodiments of docking frames 14, 16 and UPS modules 18 will be described, which can be used in the UPS system 10 described above. The general principles of the UPS system 10 described above also apply for use of the different docking frames 14, 16 and UPS modules 18.

Figure 3:
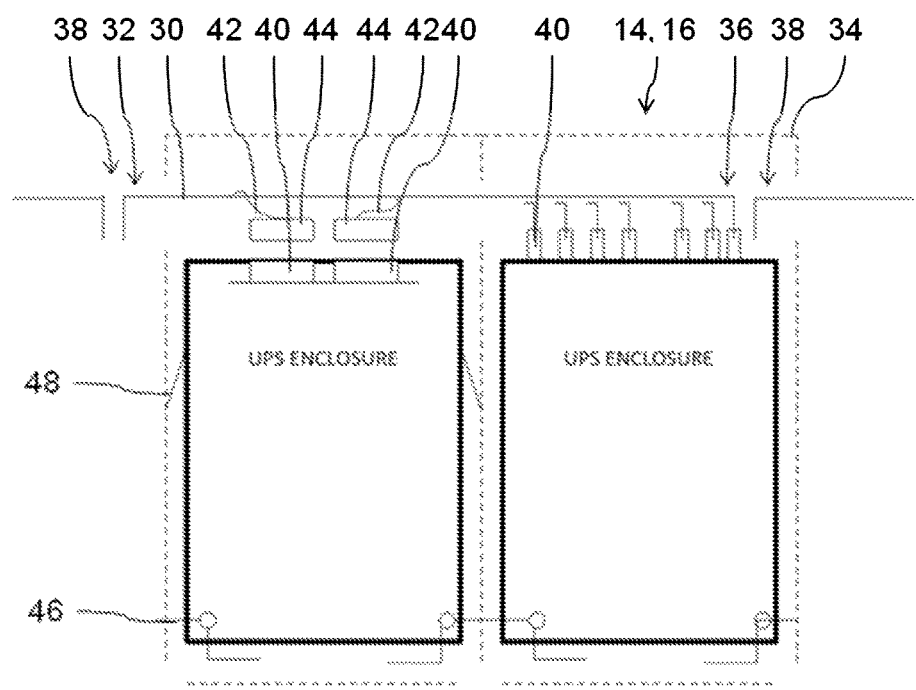
FIG. 3 shows a frontal view of a schematic drawing of a docking frame of the uninterrupted power supply system of FIG. 1 without uninterrupted power supply modules connected thereto according to a second and third embodiment.
Figure 4:
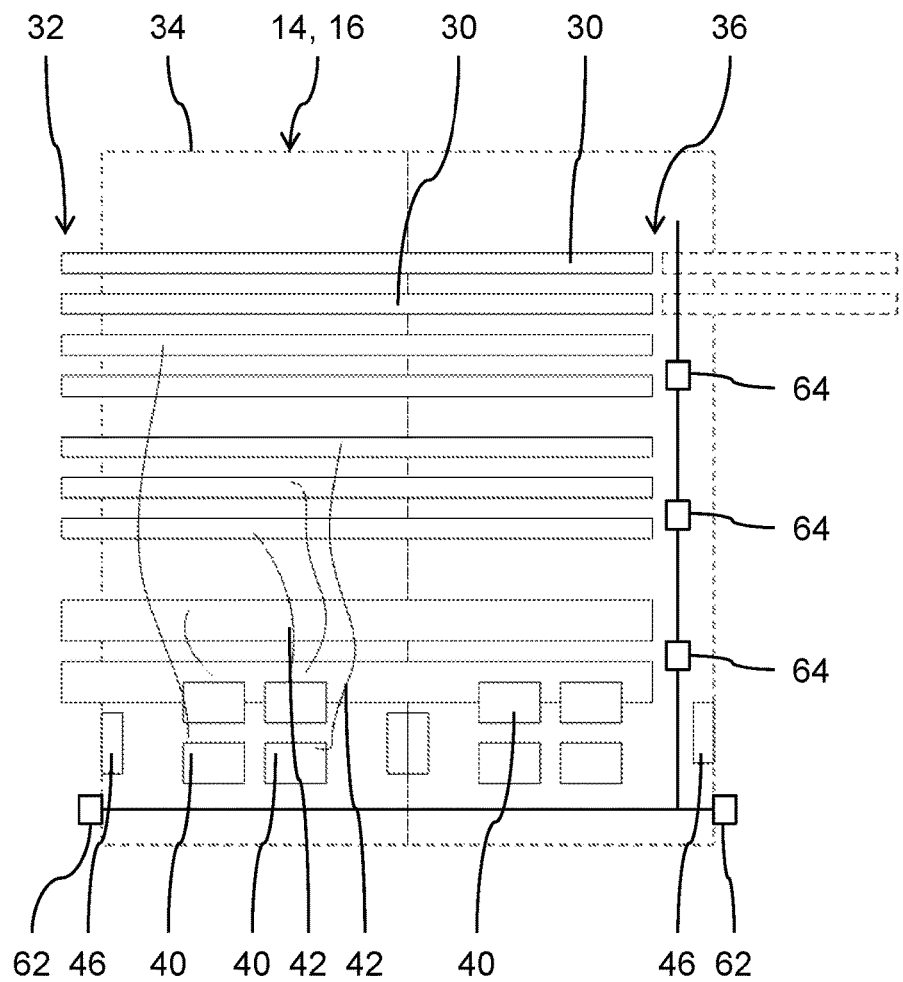
FIG. 4 shows a frontal view of a schematic drawing of a docking frame of the uninterrupted power supply system of FIG. 1 without uninterrupted power supply modules connected thereto according to the second embodiment.
Figure 5:
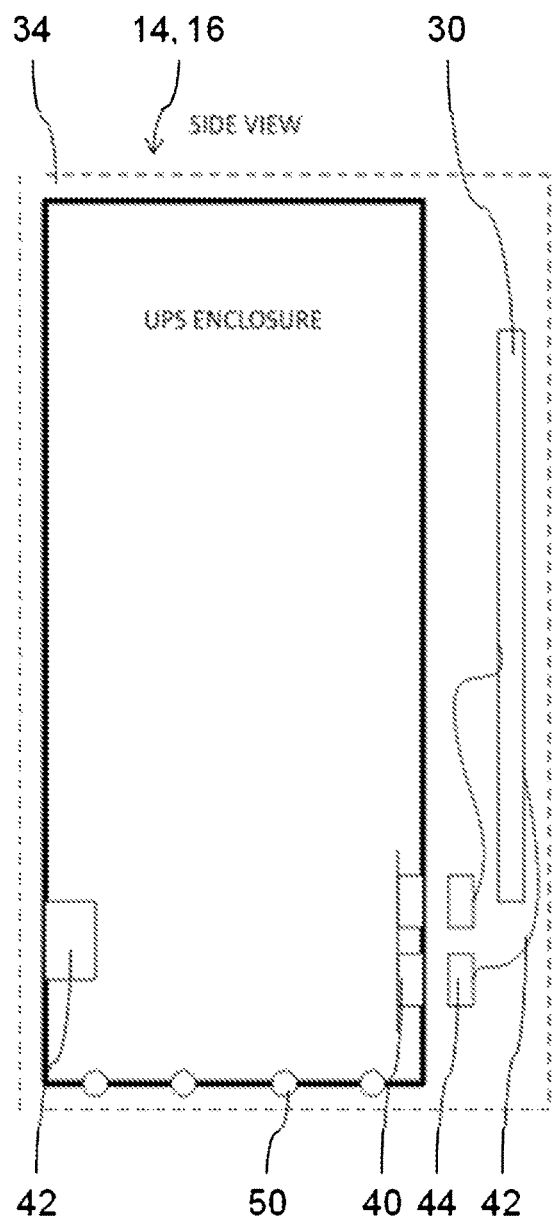
FIG. 5 shows a side view of the docking frame according to the second embodiment of FIG. 4.

FIGS. 3, 4, and 5 show a docking frame 14, 16 according to a second embodiment, which is can be provided as shallow frame 14 or highframe 16 in accordance with the above described embodiment. In particular, the second embodiment refers to the left part of FIG. 3 and the FIGS. 4 and 5.

The empty docking frame 14, 16, which can be seen in FIG. 4 in a frontal view, has multiple horizontal bus bars 30, which extend horizontally within the docking frame 14, 16. A first end 32 of the horizontal bus bars 30 extends over a housing 34 of the docking frame 14, 16, whereas the other, second end 36 remains inside the housing 34. Accordingly, the two ends 32, 36 of the horizontal bus bars 30 are part of bus connection means 38 for horizontally interconnecting further docking frames 14, 16 and/or the I/O module 12, thereby forming a horizontal bus. The connection refers to an electrical connection. Further details in respect to the bus connection means 38 are given below.

As can be seen in FIG. 4, the docking frames 14, 16 comprise multiple horizontal bus bars 30. The horizontal bus bars 30 are provided in accordance with a system topology through choice of the horizontal bus bars 30 at pre-defined positions.

The docking frame 14, 16 of the second embodiment comprises electrical power connectors 40 for electrically connecting the UPS module 18 to the docking frame 14, 16. In this embodiment, the power connectors 40 are multi pole connectors for connecting multiple poles at the same time. The multiple poles are wired by cables 42 and internal plugs 44 to the horizontal bus bars 30 of the docking frame 14, 16. The power connectors 40 together with the internal plugs 44 are provided for floating assembly for facilitating insertion of the UPS module 18.

The docking frame 14, 16 of the second embodiment further comprises a lever assembly 46 for secure insertion of the UPS modules 18 and for locking the UPS modules 18 in the access position 20. The docking frame 14, 16 of the second embodiment also comprises lateral guiding frames 48 as guiding means for alignment of the UPS modules 18. As can be seen in FIG. 5, the docking frame 14, 16 comprises at its bottom wheels 50 for facilitating the insertion of the UPS modules 18. It is to be noted that in FIG. 5, the horizontal bus bars 30 are only shown schematically.

Figure 6:
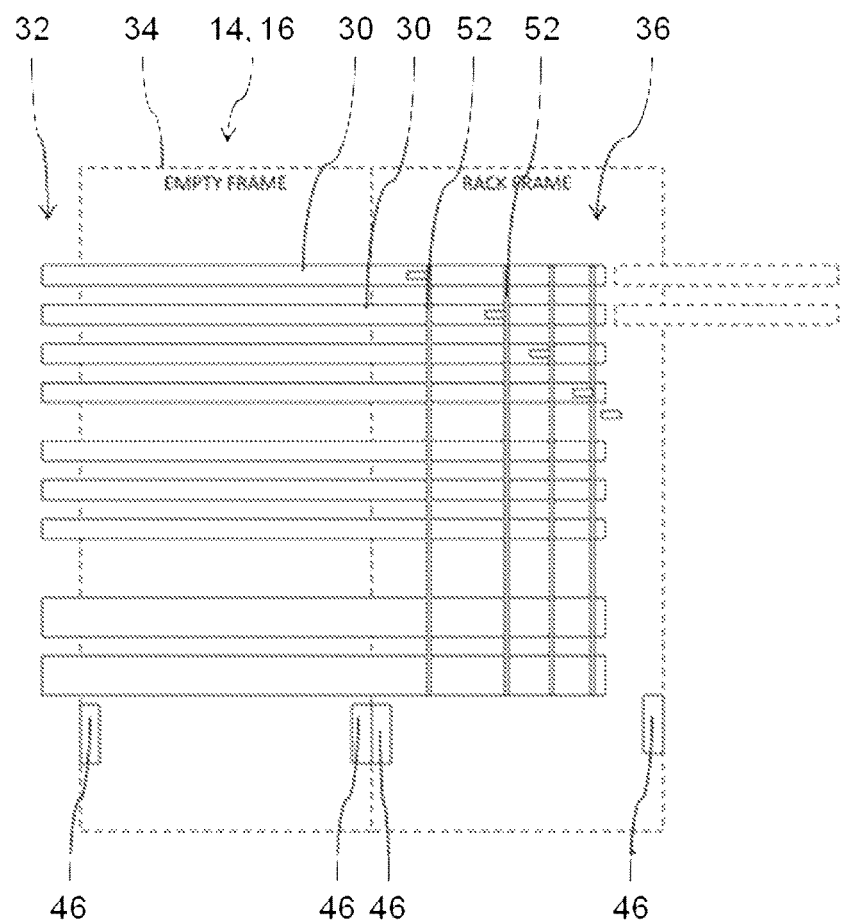
FIG. 6 shows a frontal view of a schematic drawing of a docking frame of the uninterrupted power supply system of FIG. 1 without uninterrupted power supply modules connected thereto according to the third embodiment.
Figure 7:
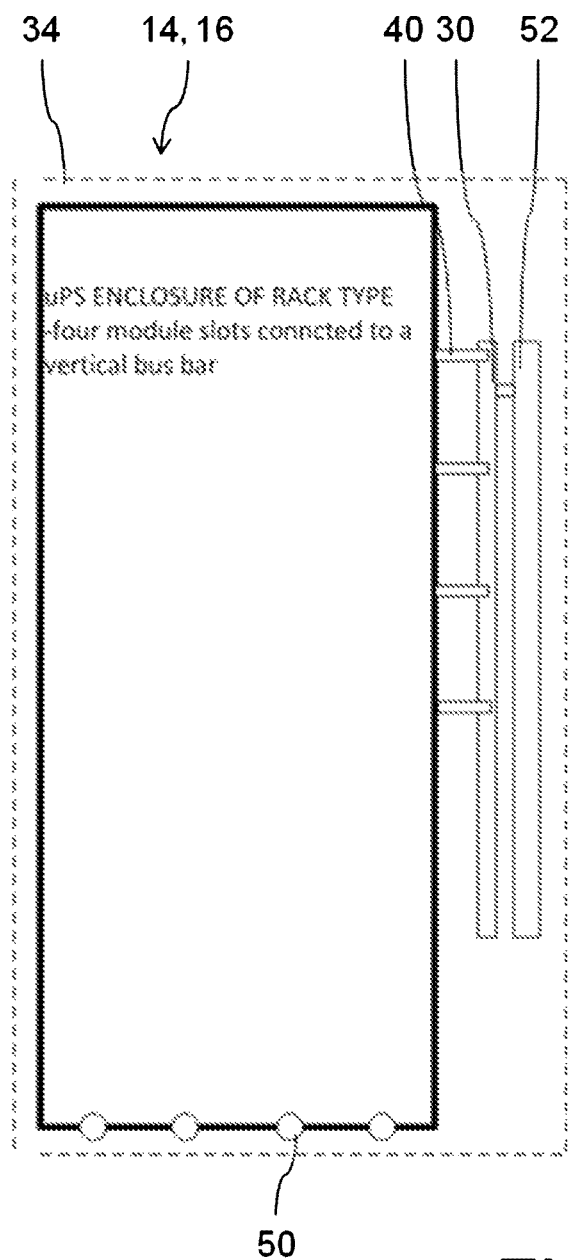
FIG. 7 shows a side view of the docking frame according to the third embodiment of FIG. 6.

FIGS. 3, 6, and 7 show a docking frame 14, 16 according to a third embodiment, which is can be provided as shallow frame 14 or highframe 16 in accordance with the above described embodiments. In particular, the third embodiment refers to the right part of FIG. 3 and the FIGS. 6 and 7. The docking frame 14, 16 of the third embodiment is provided to receive multiple UPS modules 18 on top of each other, i.e. the UPS modules 18 are stacked on each other inside the access position 20.

The empty docking frame 14, 16, which can be seen in FIG. 6 in a frontal view, has multiple horizontal bus bars 30, as described above in respect to the second embodiment. Furthermore, the docking frame 14, 16 of the third embodiment comprises multiple vertical bus bars 52 for electrical connection of the UPS modules 18. Accordingly, the vertical bus bars are electrically connected to the horizontal bus bars 30. The vertical bus bars 52 are provided in accordance with a system topology through choice the vertical bus bars 52 at pre-defined positions, thereby e.g. indicating maximum currents or used voltages.

According to the third embodiment, the docking frame 14, 16 comprises power connectors 40, which are provided as single pole connectors, for electrically connecting the UPS modules to the bus bars 30, 52 of the docking frame 14, 16. The power connectors 40 are provided as clips for directly connecting the UPS modules 18 to the vertical bus bars 52, i.e. the power connectors 40 are clipped on the vertical bus bars 52. Furthermore, the power connectors 40 are provided as hot swap connectors for connection or removal of the UPS modules 18 without the use of tools by simple insertion of the UPS modules 18 into the docking frame 14, 16, whereby the operation of the UPS system 10 does not have to be interrupted. The multiple single pole connectors 40 are provided in accordance with the positions of the vertical bus bars 52.

Also the docking frame 14, 16 of the third embodiment comprises a lever assembly 46, lateral guiding frames 48 and wheels 50 as described above in respect to the second embodiment. It is to be noted that also in FIG. 7, the horizontal bus bars 30 are only shown schematically.

Figure 8:
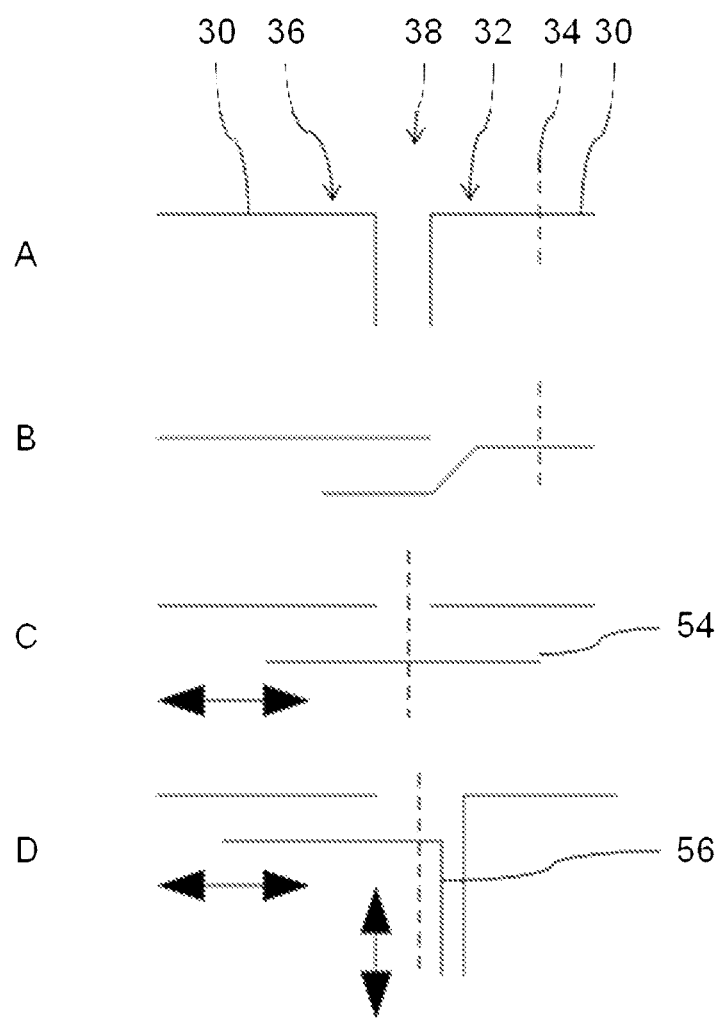
FIG. 8 shows a schematic view of bus connection means for connection of the docking frames according to a fourth, fifth, sixth and sevenths embodiments in accordance with the previously shown embodiments.

FIGS. 8 to 12 refer to details of the bus connection means 38, which are applicable to the aforementioned embodiments. FIG. 8 shows bus connection means 38 according to a fourth, fifth, sixth, and sevenths embodiment, which are denoted A, B, C, and D, respectively.

Figure 9:
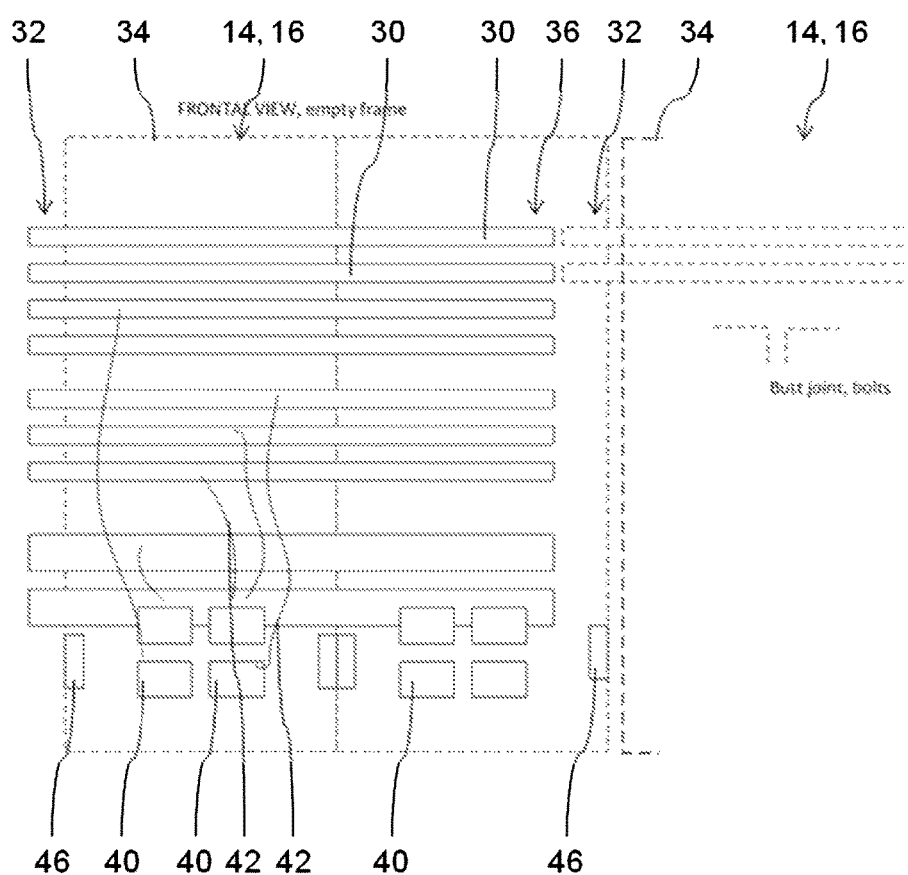
FIG. 9 shows a frontal view of the docking frame of the second embodiment shown in FIG. 3 with an additional horizontal, schematically shown connection to a neighboring docking frame with bus connection means shown in FIG. 8 according to the fourth embodiment.

In the fourth embodiment, which is also schematically shown in FIG. 9, the bus connection means 38 are formed by the ends 32, 36 of the horizontal bus bars 30. The ends 32, 36 of the horizontal bus bars 30 are provided as angled ends, which can be abutted to each other for connection. Accordingly, the angled ends can be provided with holes for being connected, e.g. by means of screws or bolts. Accordingly, the docking frames 14, 16 have to be adjusted relative to each other for making the electrical connection using the bus connection means 38. In the fourth embodiment, the ends 32, 36 of the horizontal bus bars 30 have the same shape.

In the fifth embodiment, the bus connection means 38 are also formed by the ends 32, 36 of the horizontal bus bars 30. The first end 32 of the horizontal bus bars 30 is provided as an overlapping end, which is bend out of the axis of the horizontal bus bar 30, extending in parallel to the axis. The second end 36 of the horizontal bus bars 30 is provided as straight end. For connection, the neighboring docking frames 14, 16 have to be aligned so that the ends 32, 36 of the horizontal bus bars overlap. The ends 32, 36 can be provided with holes for being connected, e.g. by means of screws or bolts.

Figure 10:
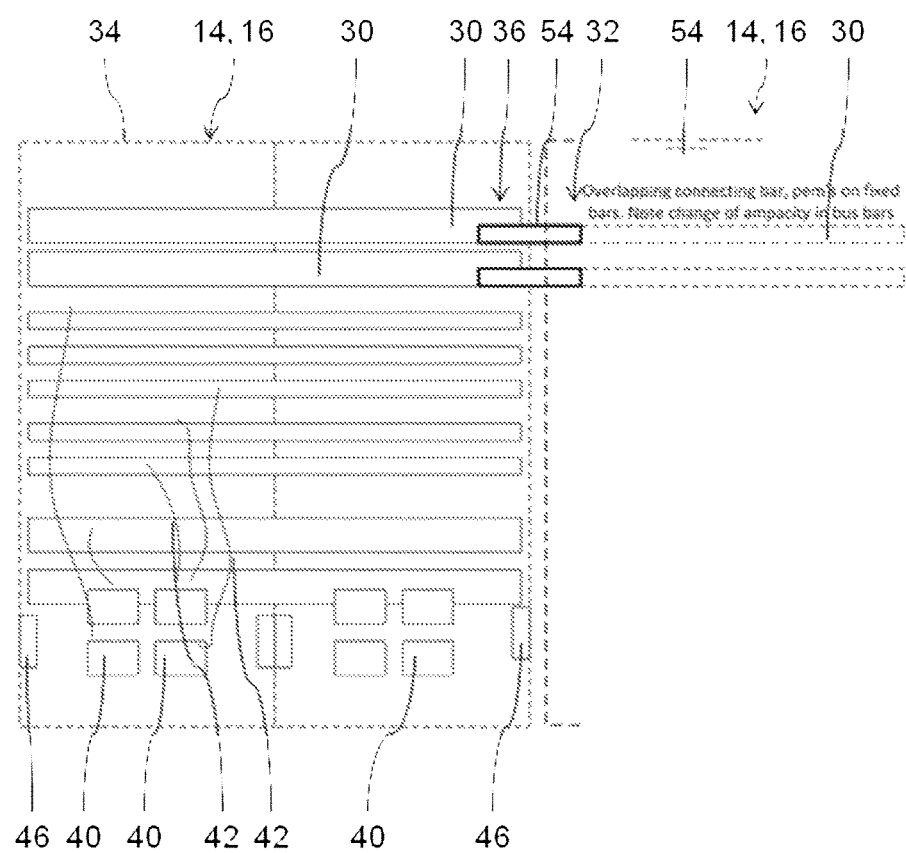
FIG. 10 shows a frontal view of the docking frame of the second embodiment shown in FIG. 3 with an additional horizontal, schematically shown connection to a neighboring docking frame with bus connection means shown in FIG. 8 according to the sixth embodiment.

In the sixth embodiment, which is also schematically shown in FIG. 10, the bus connection means 38 comprise the ends 32, 36 of the horizontal bus bars 30 and an additional tie bar 54. The ends 32, 36 of the horizontal bus bars 30 are provided as straight ends. The tie bars 54 are mounted parallel to the ends 32, 36 of the horizontal bus bars 30 of the neighboring docking frames 14, 16. Accordingly, the ends 32, 36 and the tie bar 54 are provided with holes for being connected, e.g. by means of screws or bolts. By means of the tie bar, lateral alignment of the neighboring docking frames 14, 16 is facilitated, e.g. when the holes are provided having an oval shape. In the sixth embodiment, the ends 32, 36 of the horizontal bus bars 30 have the same shape.

Figure 11:
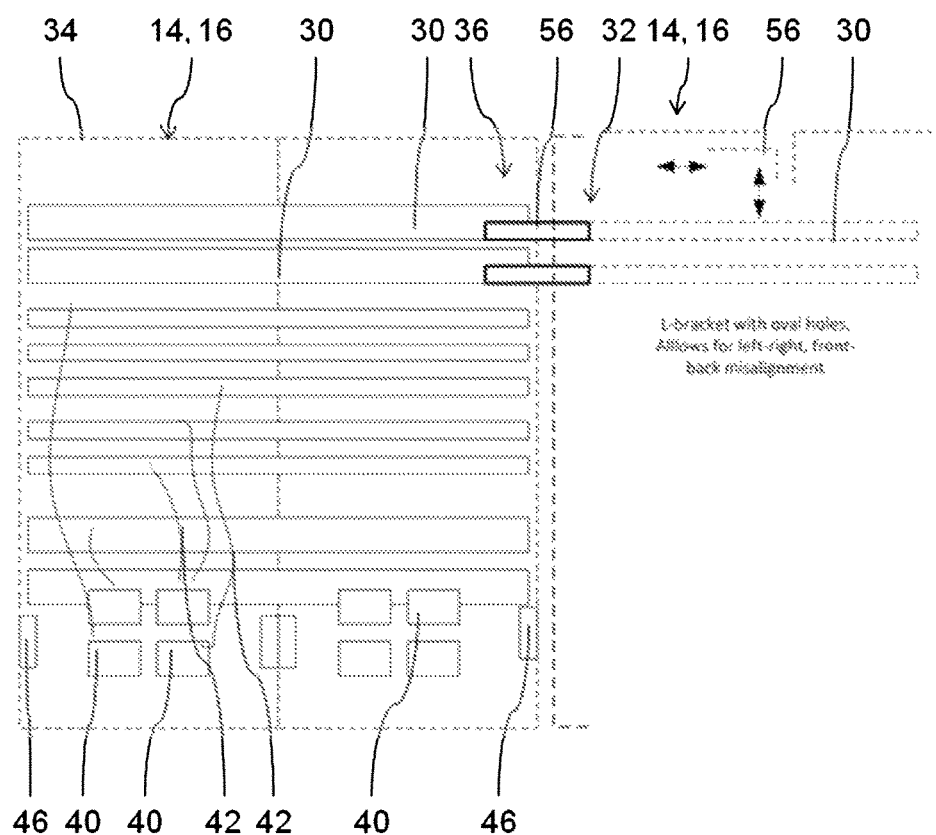
FIG. 11 shows a frontal view of the docking frame of the second embodiment shown in FIG. 3 with an additional horizontal, schematically shown connection to a neighboring docking frame with bus connection means shown in FIG. 8 according to the seventh embodiment.
Figure 12:
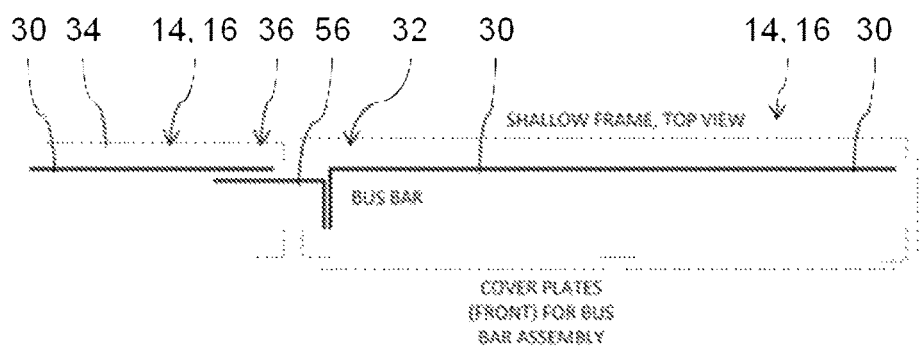
FIG. 12 shows a top view of the connection of docking frames of FIG. 11 according to the seventh embodiment.

In the seventh embodiment, which is also schematically shown in FIGS. 11 and 12, the bus connection means 38 comprise the ends 32, 36 of the horizontal bus bars 30 and additional L-type connection brackets 56. The first end 32 of the horizontal bus bars 30 is provided as an angled end. The second end 36 of the horizontal bus bars 30 is provided as straight end. The ends 32, 36 and the connection brackets 56 are provided with holes for being connected, e.g. by means of screws or bolts. The holes are provided having an oval shape for compensation of misalignment of the docking frames 14, 16 in two dimensions.

As can be seen in FIGS. 9 to 12, the connection means 38 are located within the docking frames 14, 16 for mounting, so that only frontal access is required.

Figure 13:
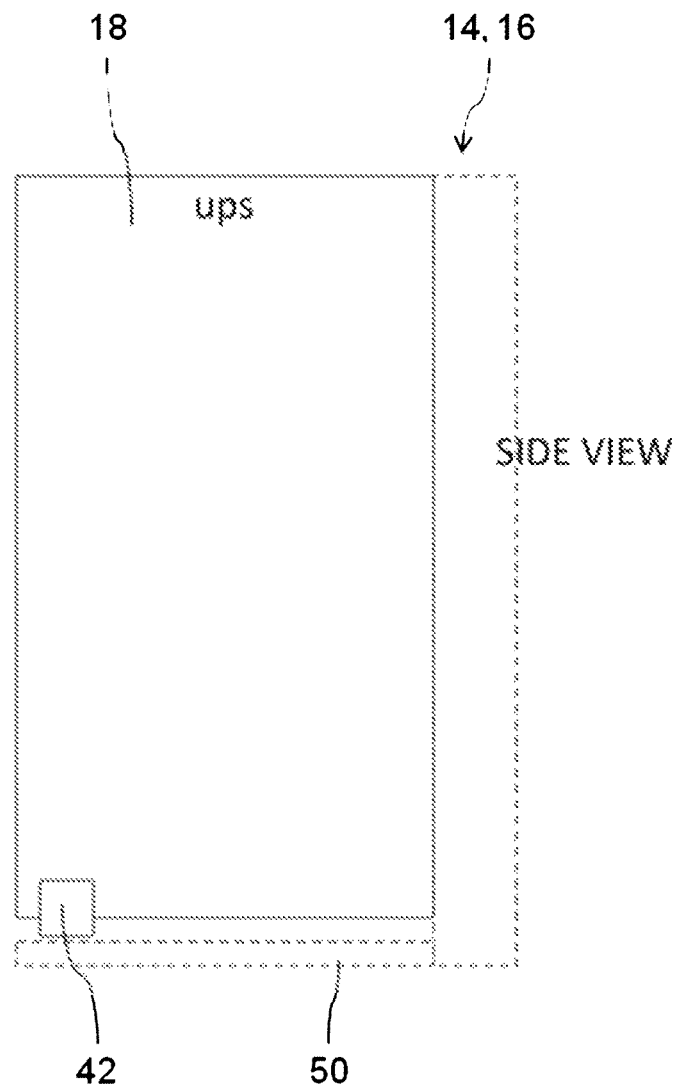
FIG. 13 shows a side view of a docking frame according to an eights embodiment.

FIG. 13 shows a docking frame 14, 16 according to an eights embodiment, which is can be provided as shallow frame 14 or highframe 16 in accordance with the above described embodiments. The docking frame 14, 16 of the eights embodiment with a foot 58. The UPS modules 18 can be located on top of the foot 58 within the docking frame 14, 16.

In accordance with the above embodiments, the docking frame 14, 16 is provided with external control bus connector 62 for horizontally connecting to a control bus and internal control bus connectors 64 for connection of the UPS modules 18. The docking frame 14, 16 is also provided with air channels for receiving exhaust air from the UPS modules 18.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST

10 uninterrupted power supply system, UPS system
12 input/output module, I/O module, I/O enclosure
14 docking frame, highframe
16 docking frame, shallow frame
18 uninterrupted power supply module, UPS module
20 access position
22 removable cover
24 guiding means, guiding rails
30 horizontal bus bar
32 first end of horizontal bus bar
34 housing
36 second end of horizontal bus bar
38 bus connection means
40 power connector
42 cable
44 internal plug
46 lever assembly
48 guiding frame, guiding means
50 wheels
52 vertical bus bar
54 tie bar
56 connection bracket
58 foot
62 external control bus connector
64 internal control bus connector

The invention claimed is:

1. An uninterrupted power supply system for uninterrupted power supply with a power of at least tens of kilowatt, comprising:
an I/O module in electrical communication with the uninterrupted power supply system,
at least one docking frame configured for receiving at least one uninterrupted power supply module, the at least one docking frame comprising
connection means for electrically connecting the uninterrupted power supply module horizontally to the at least one docking frame or an I/O module, the connection means comprises a bus connection for providing the electrical connection to the docking frame or the I/O module,
and the at least one uninterrupted power supply module connectable to the at least one docking frame wherein:

the I/O module, the at least one docking frame and the at least one uninterrupted power supply module are connected in a horizontal arrangement.

2. The uninterrupted power supply system according to claim 1, wherein the docking frame is for receiving at least one uninterrupted power supply module for uninterrupted power supply systems, with a power of at least tens of kilowatts, the docking frame comprising:

connection means for electrically connecting the uninterrupted power supply module horizontally to at least another docking frame or the I/O module, wherein the connection means comprises at least one bus connection for providing the electrical connection to the at least another docking frame or the I/O module.

3. The uninterrupted power supply system according to claim 1, wherein the docking frame comprises at least one bus connection for providing the electrical connection to the at least another docking frame or the I/O module at each lateral side.

4. The uninterrupted power supply system according to claim 2, wherein the bus connection at the lateral sides are interconnected by a horizontal bus bar.

5. The uninterrupted power supply system according to claim 3, wherein the bus connection at the lateral sides are interconnected by a horizontal bus bar.

6. The uninterrupted power supply system according to claim 1, wherein the docking frame is configured to receive multiple uninterrupted power supply modules.

7. The uninterrupted power supply system according to claim 1, wherein the docking frame comprises at least one vertical bus bar for electrical connection of the at least one uninterrupted power supply module, wherein the at least one vertical bus bar is electrically connected to the bus connection.

8. The uninterrupted power supply system according to claim 1, wherein the docking frame comprises at least one electrical power connector for electrically connecting the at least one uninterrupted power supply module to the docking frame.

9. The uninterrupted power supply system according to claim 1, wherein the docking frame comprises guiding means for guiding the at least one uninterrupted power supply module for insertion into the docking frame.

10. The uninterrupted power supply system according to claim 1, wherein the docking frame comprises an external control bus connector for horizontally connecting to a control bus for control of the at least one uninterrupted power supply module and at least one internal control bus connector for connection of the at least one uninterrupted power supply module.

11. The uninterrupted power supply system according to claim 1, wherein the bus connection comprises a L-type connection bracket.

12. The uninterrupted power supply system according to claim 1, wherein the docking frame includes an additional ingress protection level for the at least one uninterrupted power supply module.

13. The uninterrupted power supply system according to claim 1, wherein the docking frame includes at least one air channel for receiving exhaust air from the at least one uninterrupted power supply module or for providing air to the at least one uninterrupted power supply module.

14. The uninterrupted power supply system according to claim 1, further comprising:

an uninterrupted power supply module for uninterrupted power supply systems with a power of at least tens of kilowatt, and a connection means for electrically connecting the uninterrupted power supply module horizontally to the docking frame or the I/O module;

wherein the connection means comprises at least one bus connection for providing the electrical connection to the docking frame or the I/O module.

15. The uninterrupted power supply system according to preceding claim 14, wherein the uninterrupted power supply module comprises wheels or a sliding support for insertion into the docking frame.

16. The uninterrupted power supply system according to claim 14, wherein the uninterrupted power supply module comprises guiding means for being guided for insertion into the docking frame.

* * * * *